(12) United States Patent
Abramovici

(10) Patent No.: US 7,146,548 B1
(45) Date of Patent: Dec. 5, 2006

(54) FIXING FUNCTIONAL ERRORS IN INTEGRATED CIRCUITS

(75) Inventor: Miron Abramovici, Berkeley Heights, NJ (US)

(73) Assignee: Dafca, Inc., Framingham, MA (US)

( * ) Notice: Subject to any disclaimer, the term of this patent is extended or adjusted under 35 U.S.C. 154(b) by 239 days.

(21) Appl. No.: 10/929,709

(22) Filed: Aug. 30, 2004

Related U.S. Application Data

(63) Continuation-in-part of application No. 10/425,101, filed on Apr. 28, 2003, now Pat. No. 7,058,918.

(51) Int. Cl.
*G01R 31/28* (2006.01)

(52) U.S. Cl. .................................................. 714/724

(58) Field of Classification Search ................. 714/724, 714/726, 727, 729, 733
See application file for complete search history.

(56) References Cited

U.S. PATENT DOCUMENTS

| | | | | |
|---|---|---|---|---|
| 5,644,578 A | * | 7/1997 | Ohsawa | ...................... 714/719 |
| 6,877,122 B1 | * | 4/2005 | Whetsel | ...................... 714/727 |

* cited by examiner

*Primary Examiner*—James C Kerveros
(74) *Attorney, Agent, or Firm*—Henry T. Brendzel

(57) ABSTRACT

An arrangement that includes a core with a flaw is effectively made error free with an auxiliary circuit that interacts with input and output leads of the core, which detected occurrence of an input that causes an erroneous output at the core, and modified that output either essentially directly, or through changes in accessible core inputs.

24 Claims, 2 Drawing Sheets

US 7,146,548 B1

FIXING FUNCTIONAL ERRORS IN INTEGRATED CIRCUITS

RELATED APPLICATION

This application is a continuation in part of U.S. patent application Ser. No. 10/425,101, filed Apr. 28, 2003, now U.S. Pat. No. 7,058,918 issued Jun. 6, 2006, which is hereby incorporated by reference as if set forth fully herein.

BACKGROUND

This invention relates to integrated circuits and, more particularly, to fixing errors in already fabricated integrated circuit designs, or in integrated circuits with significant portions thereof being outside the bounds of redesign efforts.

Some present day designs of integrated circuits (ICs) comprise a plurality of module, or core, designs (and associated designed layouts) that are interconnected within the integrated circuit to create a whole. Such ICs are sometimes referred to as "systems on a chip" (SoCs). The designed SoCs may include core designs that the party designing the integrated circuit has created before, core designs purchased from another party, and core designs created specifically for the subject integrated circuit, sometimes is referred to as user defined logic (UDL) blocks.

The aforementioned Ser. No. 10/425,101 patent application discloses a beneficial design approach for SoCs, where each core is encompassed with a wrapper that includes functionally reconfigurable module (FRM). A wrapper is a collection of elements, which collection includes a circuit interface between essentially every input terminal of the core and circuitry outside the core, and between essentially every output terminal of the core and circuitry outside the core. The FRM can be configurably connected to any of the circuit interfaces, and inherently also can be configured to realize any function. Spare leads between wrappers are disclosed, which enable connectivity from an FRM directly to circuitry outside the wrapper. The circuitry outside the core can be another wrapper, a UDL block, inputs of the IC, or outputs of the IC.

FIG. 1 depicts an arrangement in accord with the disclosure presented in the aforementioned Ser. No. 10/425,101 patent application, where an SoC includes core 10 that is wrapped by wrapper 11, core 20 that is wrapped by wrapper 21, and core 30 (a UDL block) that is wrapped by wrapper 31. Illustratively, core 10 has three inputs and four outputs (12, 13, 14, and 15). Core 20 has four inputs, three outputs (22, 23, and 24) that are needed for the SoC design, and one output (25) that is available, but is not needed for the FIG. 1 SoC design. In the original design, 25 was an internal signal of core 20, and 25 has been made available to be processed by the wrapper 21. UDL 30 has three inputs and two outputs (32, and 33) that are connected to the SoC output terminals of the IC. In addition to the necessary signal connections between wrappers 11 and 21, and between wrappers 21 and 31, including spare leads, the FIG. 1 SoC includes manager circuit 40 through which control is exercised over the SoC. It accepts a system clock, a test clock, a control signal, and information through Scan-in input 41. This information is injected into the Scan-in (SI) input of wrapper 11. The Scan-out (SO) output of wrapper 11 is connected to the SI input of wrapper 21, the SO output of wrapper 21 is connected to the SI input of wrapper 31, and the SO output of wrapper 31 is connected to a terminal of the SoC. Input 41 and the daisy chain connection of the SI and SO leads of the wrappers as described above allows the installation of configuration information for the wrappers, and entry of information into all of the flip-flops within wrappers 11, 21, and 31, as well is within cores 10, 20, and 30. The SO output 42 provides for outputting the states of the flip-flops within cores 10, 20, and 30 via circuit 40. Of course, other embodiments are possible, where, for example, there is a separate path for scanning in and out the flip-flops within the cores, and for scanning in and out the flip-flops within the FRMs.

All ICs go through an extensive pre-silicon design verification process that attempts to find as many errors as possible before the IC is manufactured. Nevertheless, about two thirds of the newly fabricated chips have errors that are discovered during the first silicon debug stage. Currently, errors in silicon can be corrected only by remanufacturing the IC. This, of course, is an expensive process. It is also time consuming, often taking several months to complete.

SUMMARY

The deficiencies of prior art are ameliorated, and an advance in the art is achieved in accord with the principles disclosed herein by correcting errors of a core through auxiliary circuitry, within or outside the integrated circuit that correct the errors. Thus, a core with a flaw is effectively made error free.

DETAILED DESCRIPTION

Figure 1:
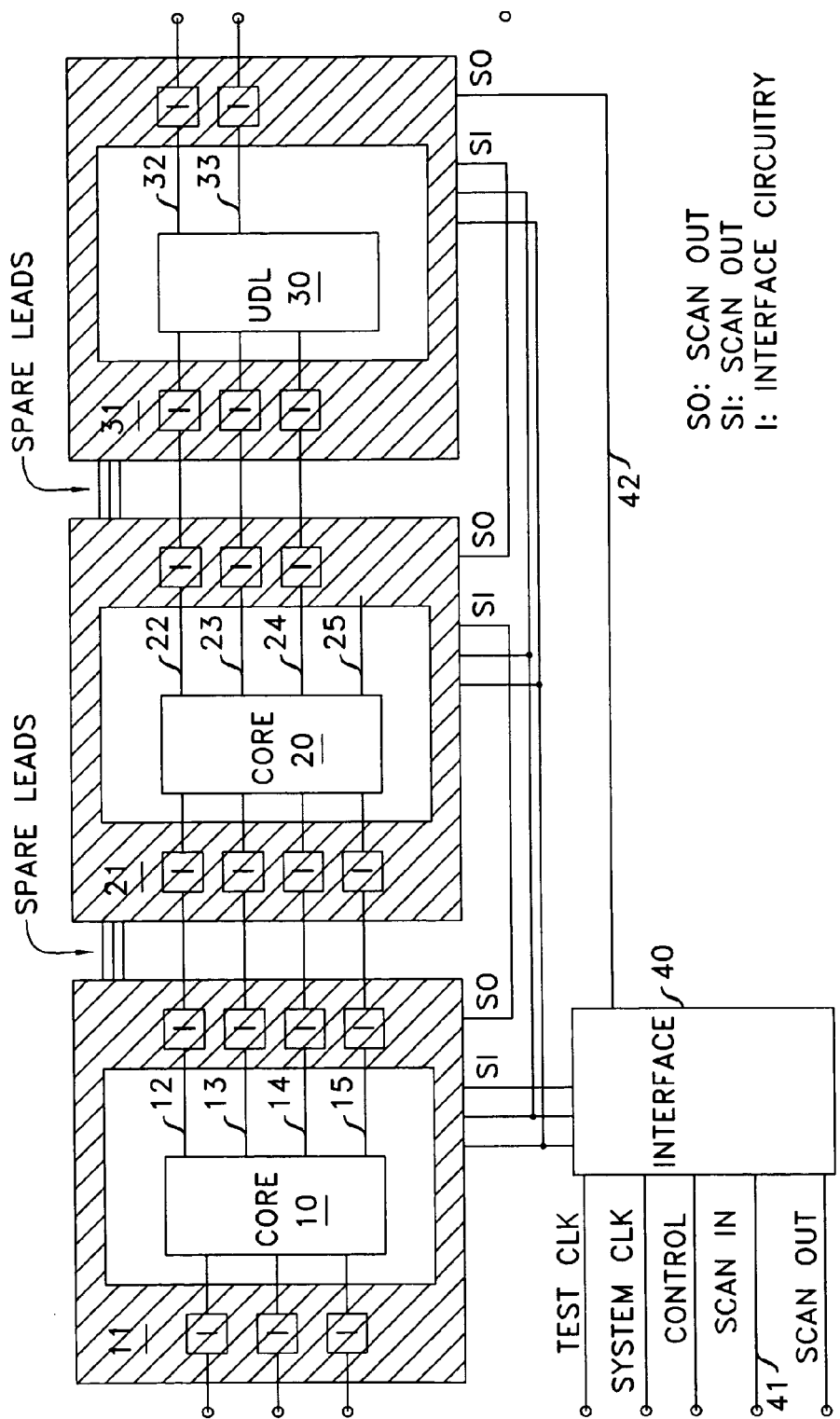
FIG. 1 shows an SoC arrangement that includes three cores, one of which is a UDL, and other of which has an available output lead that is not used.
Figure 2:
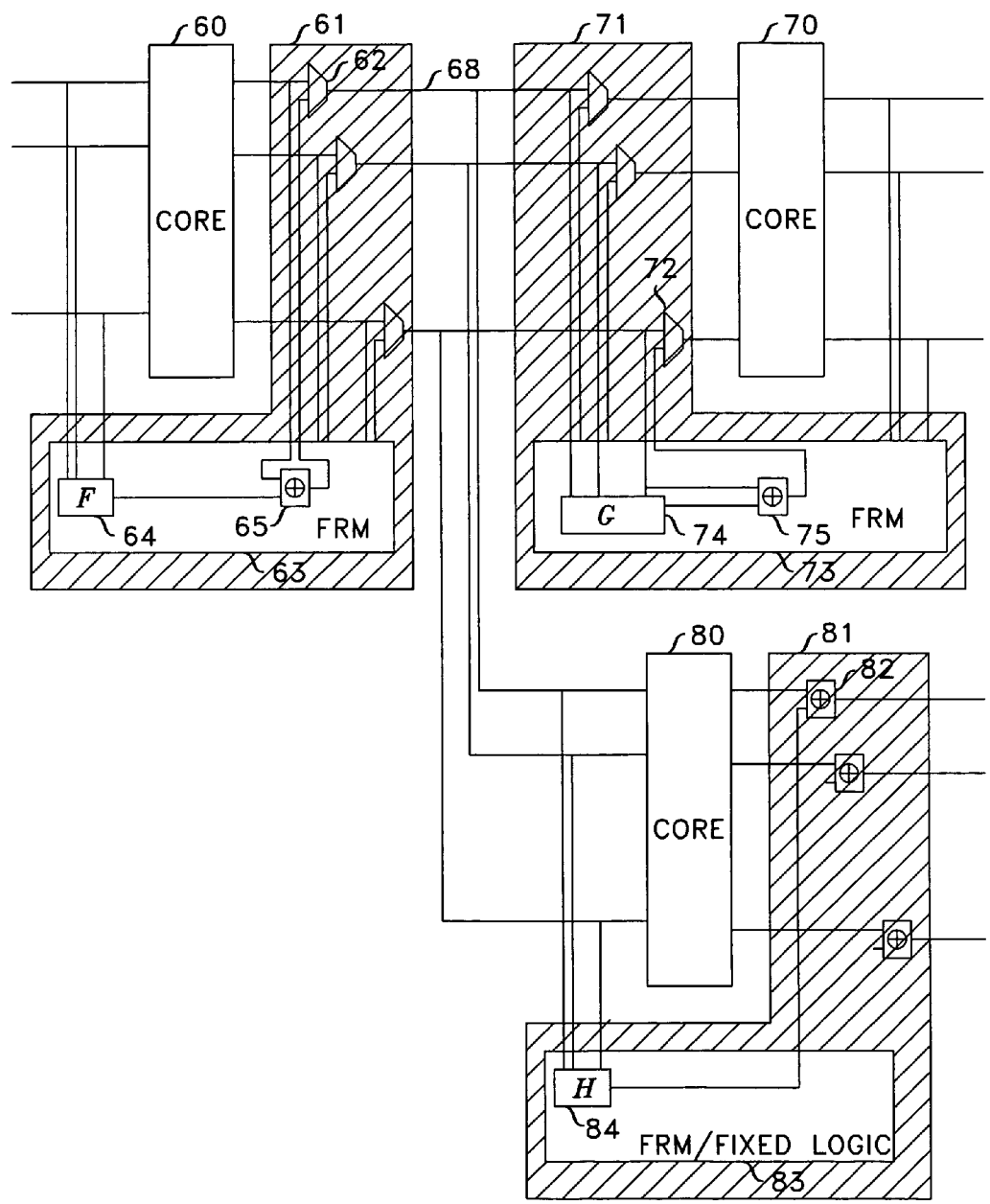
FIG. 2 demonstrates various error correcting techniques in accord with the principles disclosed herein.

FIG. 2 depicts an arrangement that illustrates a number of possible situations for error fixing. It depicts an SoC with cores 60, 70 and 80, and associated respective elements 61, 71, and 81. Elements 61, 71, and 81 may be wrappers in the sense that most of the input and output leads of the associated cores go through interface circuits within the wrappers, but they do not have to be wrappers. Indeed, none of the elements 61, 71, and 81 are depicted as wrappers. However, 61, 71, and 81 all include an element that can be used for fixing errors (63, 73, and 83, respectively) and, as depicted, elements 63, 73 and 83 are FRMs. Nevertheless, they can also be fixed logic element (combinatorial or containing memory), as suggested by the labeling of element 83.

It is further noted that elements 60–61, 70–71, and 80–81 can be three separate integrated circuits, or one circuit; and when cores 60, 70, and 80 are not within a single integrated circuit, the associated elements (61, 71 or 81, as applicable) can be within the integrated circuit that contains the associated core but can also be outside such an integrated circuit.

Returning to the FIG. 2 depiction, the input leads of each core x0-element x1 combination are connected to FRM x3 (e.g. the input leads of element 61 that are destined to core 60 are also connected to FRM 63), and the output leads of each core x0 are also connected to FRM x3 (e.g. the output leads of core 60 are connected to FRM 63). Additionally, the output leads to the core 60 are connected to two-input multiplexers, such as multiplexer 62, which also receive inputs from FRM 63, and the outputs of the multiplexers form the outputs of the 6061 element combination. Also, the input leads to element 71 are connected to two-input multiplexers, such as multiplexer 72, which also receive inputs from FRM 63, and the output leads of these multiplexers form the input leads to core 70. The control signals that define the operation of the multiplexers (e.g., 62 and 72) are not shown for sake of clarity. These signals are configured and applied by the respective FRMs.

Element 81 is similar to element 61, except that it does not have a second set of leads from FRM 83 to the interface elements that are interposed between the outputs of core 80 and the outputs of element 81 and, therefore, the multiplexers are replaced by Exclusive OR gates, such as gate 82. The control signals that are configured and applied by FRM 83 to the second leads of the Exclusive OR gates are not shown for consistency of the shown detail.

In operation, when it is determined that the design of core 60 is incorrect in the sense that a given input vector A yields an incorrect output at lead 68, for example, a circuit 64 is configured within FRM 63 that realizes the function F, which assumes the logic state 1 when the input corresponds to input A. Additionally, an Exclusive OR gate 65 is configured between the output of core 60 and multiplexer 62, and multiplexer 62 is controlled to pass the output of gate 65 to the output of multiplexer 62. Having thus configured FRM 63, the testing of the SoC can be repeated, knowing that when state A is established at the input to element 61, the output of element 61 will no longer be in error.

When core 60 is a manufactured integrated circuit and a functional error (or manufacturing defect) is discovered therein, the error can be corrected by creating a circuit that contains the elements that are necessary for fixing; i.e., elements 62, 64, and 65. Those elements can be created in a separate integrated circuit and connected to the manufactured circuit as shown in FIG. 2. This separate integrated circuit may create elements 62, 64, and 65 from reconfigurable fabric, or from fixed logic modules.

When core 60 represents a design that has been made available, it is possible to redesign core 60 to correct the discovered error, but the designer of the IC might not wish to undertake a redesign of the design that was made available, though willing to add modules to the IC. In such situation, in accord with the principles disclosed herein, an integrated circuit can be created that includes core 60 as it has been made available, and elements 62, 64, and 65 are added, auxiliary to core 60. In such an embodiment, elements 62, 64, and 65 can be created from fixed logic or, alternatively, configured within an FRM. FIG. 2 suggests that elements 64 and 65 are configured within FRM 63, whereas elements 62 are configured outside the FRM (i.e., fixed logic). This, too, is acceptable.

When element 60 is part of a SoC, since the connection between cores 60 and 70 is within the integrated circuit, element 61 must be within the integrated circuit. Still, in accord with the above disclosure, elements 64 and 65 can be created from fixed logic, as well as through a configuration of an FRM 63.

In SoC situations where there are no multiplexers between the output of a core and subsequent cores, such as in the case of core 70 in FIG. 2, the above mode of correcting errors is unavailable. However, when input multiplexers exist, such as with core 70, corrections of discovered defects can be undertaken at the input. As an aside, it might be noted that each and every input of core 70 necessarily receives a signal from other circuits, such as core 60. It is possible for a core 70 design to be one that included inputs which, in a particular SoC design are not used. With embodiments where fixing of errors is undertaken at the input, as disclosed herein, the notion includes the "not used" inputs.

It should be noted, however, that correcting output errors through changes at one or more of the inputs is difficult, and might not be possible because, generally speaking, a change in an input is likely to propagate to more than one output lead. On the other hand, it is recognized that some internal input of a core might be in error, and that error is likely to propagate to a number of outputs. Even if correcting the outputs is possible, it may be much more effective to cause a change in the signal of that internal point and thus correct all of the erroneous outputs.

To illustrate correcting design errors by controlling the inputs, if the design of core 70 is incorrect in the sense that for a given input B the output of core 70, or some internal point within the core, is in error, it is possible that an input exists (from the entire set of inputs—including the "not used" inputs) where a 1's complement of that input would cause the output to be corrected without changing any other output. If such an input exists, then the error can be corrected by configuring a circuit 74 within FRM 73 that realizes the function G, which assumes the logic state 1 when the input to element 71 corresponds to input B. Additionally, an Exclusive OR gate 75 is configured between the output of circuit 74 and multiplexer 72, and multiplexer 72 is controlled to pass the output of gate 75 to the output of multiplexer 72. Having thus configured FRM 73, the testing of the SoC can be repeated, knowing that when state B is established at the input to element 71, the output will no longer be in error.

The situation in connection with core 80 is not unlike the situation with core 60, having a circuit 84 configured within element 83 that realizes a function H in response to the input signals to core 80, which assumes the logic state 1 when the input to element 81 corresponds to input C. The core 80 arrangement differs from the core 60 arrangement only in that the output of circuit 84 is fed directly to Exclusive OR gate 82. Having thus configured FRM 83, the testing of the SoC can be repeated, knowing that when state C is established at the input to element 81, the output will no longer be in error.

The invention claimed is:

1. An arrangement comprising:
  a logic circuit core that develops a set of output signals at output leads in response to input signals applied to input leads of said arrangement that are coupled to said core, where upon the arrival of a particular set of input signals develops said set of output signals that contains one or more erroneous signals; and
  an auxiliary circuit that interacts with said input and output leads, which detects the occurrence of said particular set of input signals at said input leads and alters said set of output signals to correct said erroneous signals.

2. The arrangement of claim 1 where said auxiliary circuit is within a wrapper of said core.

3. The arrangement of claim 1 where said core is an integrated circuit and said auxiliary circuit is distinct from said integrated circuit, and connected to said input and output leads of said integrated circuit.

4. The arrangement of claim 1 where said core is manufactured within an integrated circuit and said auxiliary circuit is distinct from said core, manufactured within said integrated circuit, and connected to said input and output leads of said core.

5. The arrangement of claim 4 where said auxiliary circuit comprises a functionally reconfigurable module.

6. The arrangement of claim 1 where said auxiliary circuit comprises one or more interface circuits connected to outputs of said core and to one or more error correction circuits, each of the correction circuits addresses one error.

7. The arrangement of claim 6 where each of said correction circuits is responsive to one or more inputs of said core, developing one or more intermediate outputs that are applied to associated Exclusive OR gates that are each applied to one of said interface circuits.

8. The arrangement of claim 1 where said interface circuits and said error correction circuits are created within a functionally reconfigurable module.

9. The arrangement of claim 1 where said error correction circuits are created within a functionally reconfigurable module and said interface circuits are created within a fixed logic module.

10. The arrangement of claim 1 where said interface circuits and said error correction circuits are created within a fixed logic module.

11. The arrangement of claim 1 where said auxiliary circuit comprises one or more interface circuits connected to inputs of said core and to one or more error correction circuits.

12. The arrangement of claim 11 where each of said correction circuits is responsive to one or more inputs of said core, developing one or more intermediate outputs that are applied to associated Exclusive OR gates that are each applied to one of said interface circuits.

13. The arrangement of claim 1 further comprising additional one or more cores and respective auxiliary circuits associated with each of said associated cores, where said cores of said arrangement are coupled to each other, where at least one of the auxiliary cores associated with said cores includes a functionally reconfigurable logic with an error correcting circuit configured within it.

14. The arrangement of claim 1 where the auxiliary circuit develops a single signal to indicate detection of said occurrence of said particular set of input signals, and alters said set of output signals by applying said single signal to a combinatorial circuit coupled to said output signals.

15. The arrangement of claim 1 where the auxiliary circuit develops a single signal to indicate detection of said occurrence of said particular set of input signals, and alters said set of output signals by applying said single signal to a combinatorial circuit coupled to said input leads of said core.

16. An arrangement comprising:
a core that develops a set of output signals at output points of said arrangement that are coupled to output leads of said core in response to a set of input signals applied to input points of said arrangement that are coupled to input leads of said core, where the set of output signals that is developed in response to a particular set of input signals contains one or more errors;

a first auxiliary circuit, responsive to said set of input signals that develops, at a point, a signal to indicate detection of occurrence of said particular set of input signals; and a second auxiliary circuit connected to said core and to said first auxiliary circuit that, when said signal developed by said first auxiliary circuit at said point indicates detection of said particular set of input signals, causes said set of output signals at said output points of said arrangement to be altered to remove said one or more errors.

17. The arrangement of claim 16 where said second auxiliary circuit is interposed between at least some of the input points and input leads of said core.

18. The arrangement of claim 16 where said auxiliary circuit is interposed between at least some of the output leads of said core and said output points.

19. The arrangement of claim 16 where said arrangement is within an integrated circuit chip.

20. The arrangement of claim 16 where said arrangement is included within a chip that forms an integrated circuit.

21. The arrangement of claim 16 where said arrangement is connected to other circuitry, and both said arrangement and said other circuitry are within an integrated circuit chip.

22. The arrangement of claim 16 where said first auxiliary circuit and said second auxiliary circuit are part of a functionally reconfigurable module.

23. The arrangement of claim 22 where said functionally reconfigurable module is part of a wrapper of said core.

24. An arrangement comprising:
a core that develops a set of output signals at output points of said arrangement that are coupled to output leads of said core in response to a set of input signals applied to input points of said arrangement that are coupled to input leads of said core, where the set of output signals that is developed in response to a particular set of input signals contains one or more errors;

a first auxiliary circuit, responsive to said set of input signals that, through combinatorial logic develops a signal to indicate detection of occurrence of said particular set of input signals; and a second auxiliary circuit connected to said core and to said first auxiliary circuit that, when said signal developed by said first auxiliary circuit indicates detection of said particular set of input signals, causes said set of output signals at said output points of said arrangement to be altered to remove said one or more errors.

* * * * *